United States Patent
Kim et al.

(10) Patent No.: US 9,924,619 B2
(45) Date of Patent: Mar. 20, 2018

(54) PASSIVE LAYER FOR ATTENUATION OF NEAR-FIELD ELECTROMAGNETIC WAVES AND HEATDISSIPATION INCLUDING GRAPHENE, AND ELECTROMAGNETIC DEVICE INCLUDING THE SAME

(75) Inventors: Sang Woo Kim, Seoul (KR); Byung Hee Hong, Seoul (KR); Jaeboong Choi, Gyeonggi-do (KR); Junmo Kang, Gyeonggi-do (KR); Soon Hwi Hwang, Gangwon-do (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 121 days.

(21) Appl. No.: 14/345,996

(22) PCT Filed: Aug. 10, 2012

(86) PCT No.: PCT/KR2012/006362
§ 371 (c)(1),
(2), (4) Date: Mar. 20, 2014

(87) PCT Pub. No.: WO2013/062220
PCT Pub. Date: May 2, 2013

(65) Prior Publication Data
US 2014/0218867 A1    Aug. 7, 2014

(30) Foreign Application Priority Data

Oct. 26, 2011   (KR) ........................ 10-2011-0109863

(51) Int. Cl.
*H05K 1/02*    (2006.01)
*H05K 9/00*    (2006.01)
(Continued)

(52) U.S. Cl.
CPC ........... *H05K 9/0081* (2013.01); *B32B 9/005* (2013.01); *B32B 9/007* (2013.01); *B32B 9/04* (2013.01);
(Continued)

(58) Field of Classification Search
CPC .. H05K 9/0088; H05K 1/0216; H05K 7/2039; H05K 9/0081; H05K 13/00;
(Continued)

(56) References Cited

U.S. PATENT DOCUMENTS

2009/0011245 A1*  1/2009 Tsai .......................... B32B 9/04
                                                              428/411.1
2009/0277680 A1*  11/2009 Lee ........................ B82Y 10/00
                                                              174/377

(Continued)

FOREIGN PATENT DOCUMENTS

JP     12009-143761 A    7/2009
KR    1020090129176 A    12/2009
(Continued)

OTHER PUBLICATIONS

International Search Report dated Jan. 30, 2013; PCT/KR2012/006362.

*Primary Examiner* — Hoa C Nguyen
(74) *Attorney, Agent, or Firm* — Goldilocks Zone IP Law

(57) ABSTRACT

The present invention relates to a passive layer including graphene for the attenuation of near-field electromagnetic waves and heat dissipation. The passive layer blocks electromagnetic waves radiated from an external electronic device or prevents electromagnetic waves generated in an electronic device from emitting to the outside. The passive layer is designed to reduce interference between transmission circuits of a device in the near-field region or influence such as malfunction caused by external electromagnetic (Continued)

waves. The present invention also relates to an electromagnetic device and a circuit board, each including the passive layer.

12 Claims, 12 Drawing Sheets

(51) Int. Cl.
    *H05K 13/00* (2006.01)
    *B32B 9/00* (2006.01)
    *B32B 9/04* (2006.01)
    *C01B 32/186* (2017.01)
    *C01B 32/194* (2017.01)
(52) U.S. Cl.
    CPC ............ *B32B 9/045* (2013.01); *C01B 32/186* (2017.08); *C01B 32/194* (2017.08); *H05K 1/0216* (2013.01); *H05K 9/0088* (2013.01); *H05K 13/00* (2013.01); *B32B 2307/206* (2013.01); *B32B 2307/212* (2013.01); *B32B 2457/00* (2013.01); *H05K 1/0201* (2013.01); *H05K 2201/0323* (2013.01)
(58) Field of Classification Search
    CPC ....... H05K 2201/06; H05K 2201/0707; H05K 2201/0323; C01B 31/0484; C01B 31/0453; B32B 9/005; B32B 9/007; B32B 9/04; B32B 9/045; B32B 2307/206; B32B 2457/00; B32B 2307/212; B32B 2201/0323
    See application file for complete search history.

(56) References Cited

U.S. PATENT DOCUMENTS

| | | | | |
|---|---|---|---|---|
| 2009/0309215 A1* | 12/2009 | Kitabatake | .......... | H01L 23/3672 257/720 |
| 2011/0033677 A1* | 2/2011 | Shin | ........................ | B82Y 30/00 428/201 |
| 2011/0123776 A1* | 5/2011 | Shin | ........................ | C23C 16/26 428/172 |
| 2012/0295166 A1* | 11/2012 | Gennett | ................. | B82Y 30/00 429/314 |
| 2013/0068521 A1* | 3/2013 | Hong | ................... | H05K 9/0081 174/388 |
| 2013/0087705 A1* | 4/2013 | Hiura | ................. | G01N 23/2251 250/307 |
| 2014/0166959 A1* | 6/2014 | Bertin | ................ | G11C 13/0002 257/2 |

FOREIGN PATENT DOCUMENTS

| | | |
|---|---|---|
| KR | 1020100084383 A | 7/2010 |
| KR | 1020110014847 A | 2/2011 |
| KR | 1020110101081 A | 9/2011 |

* cited by examiner

【Figure 1】
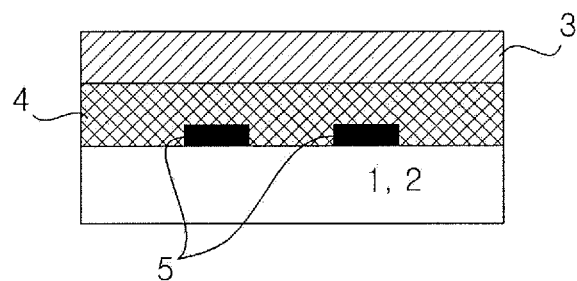
【Figure 2】
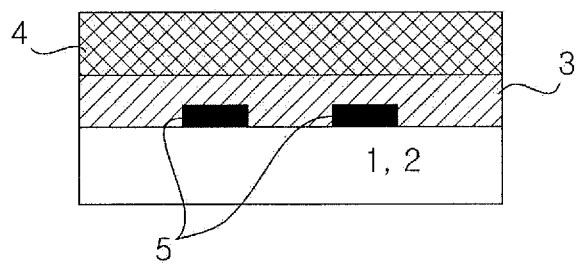
【Figure 3】
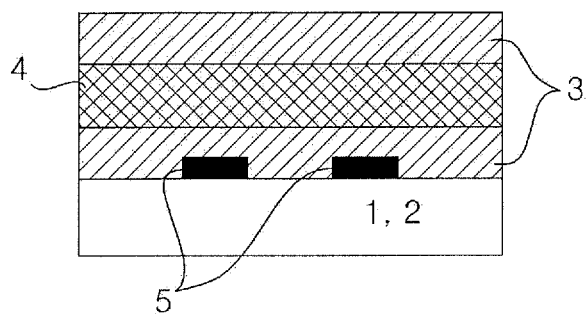
【Figure 4】
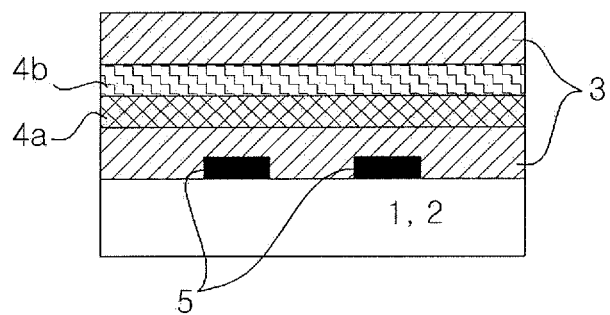

[Figure 5]
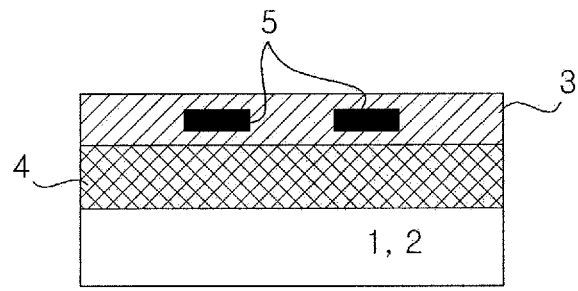
[Figure 6]
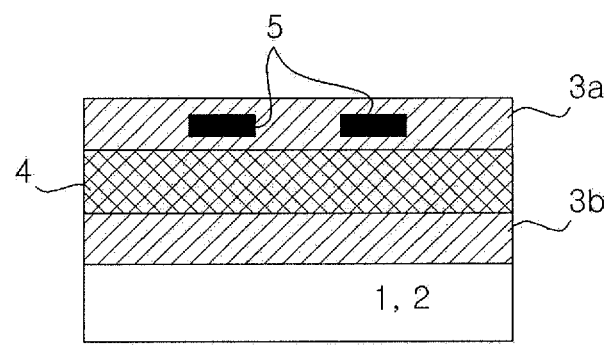
[Figure 7]
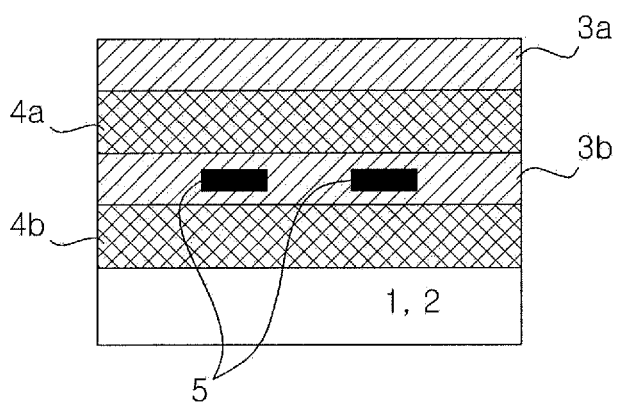

[Figure 8]
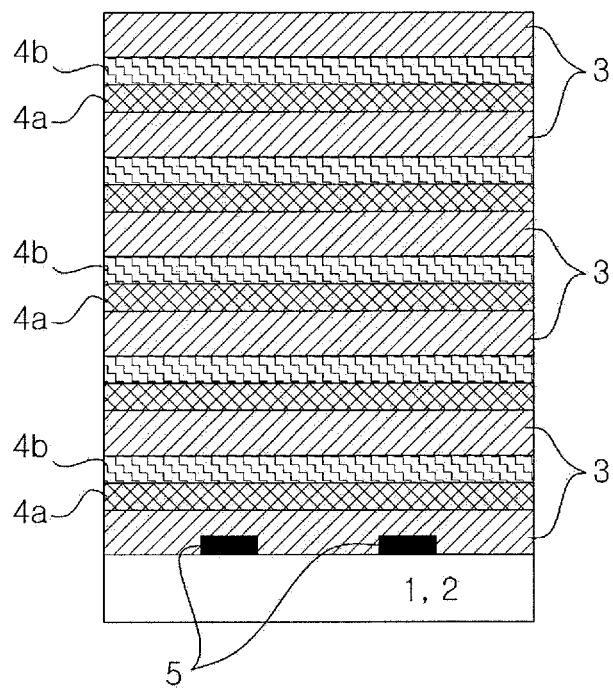
[Figure 9]
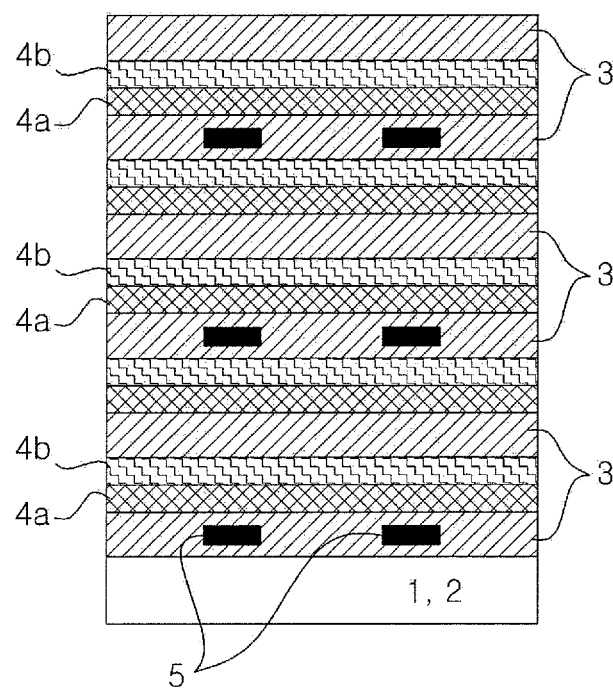

[Figure 10]
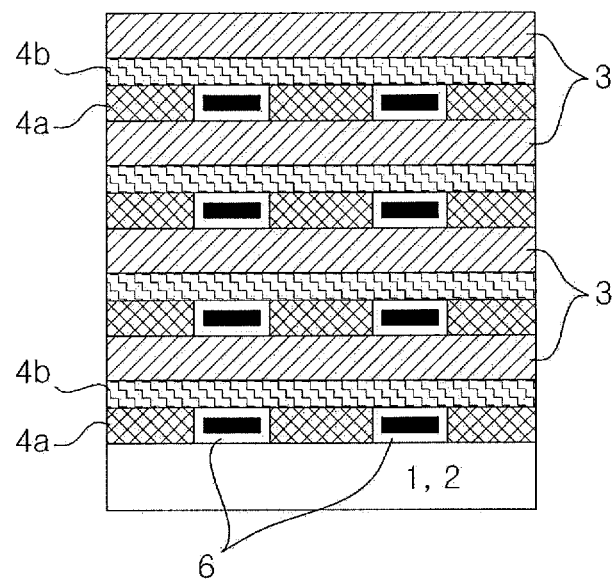
[Figure 11]
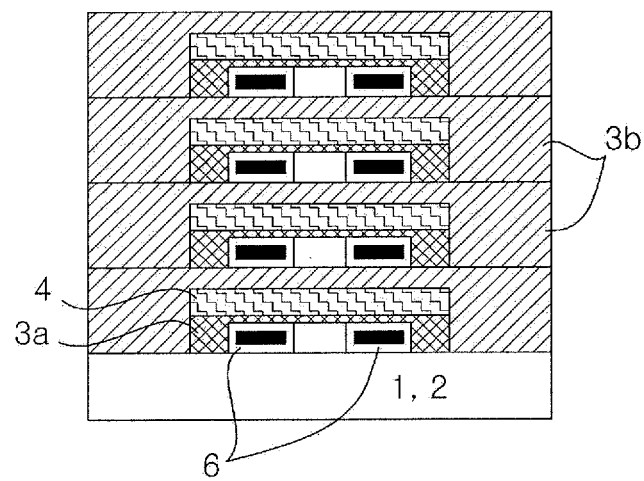

[Figure 12]
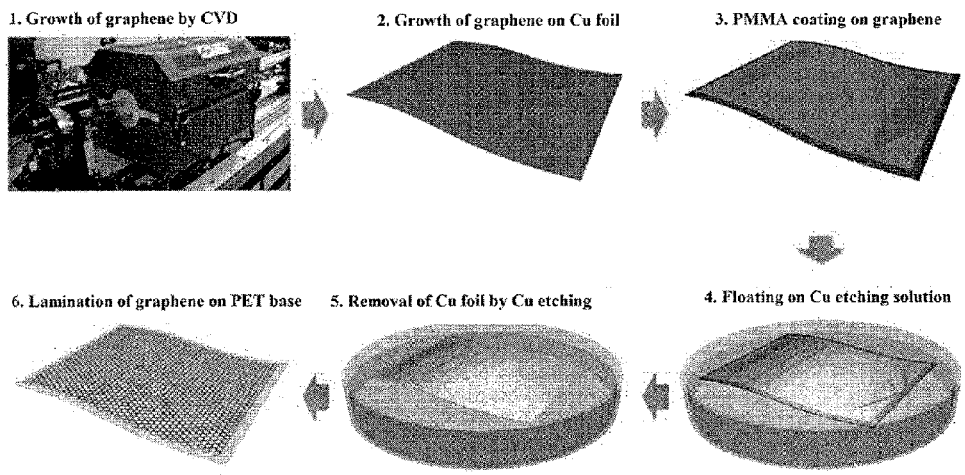
[Figure 13]
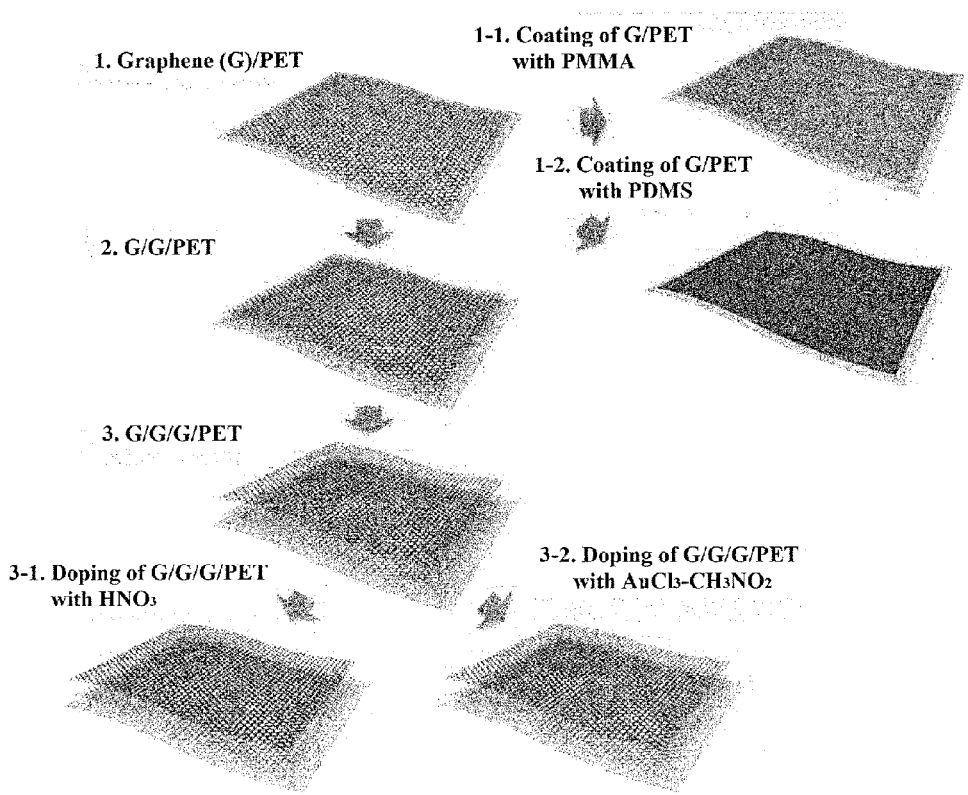

[Figure 14]
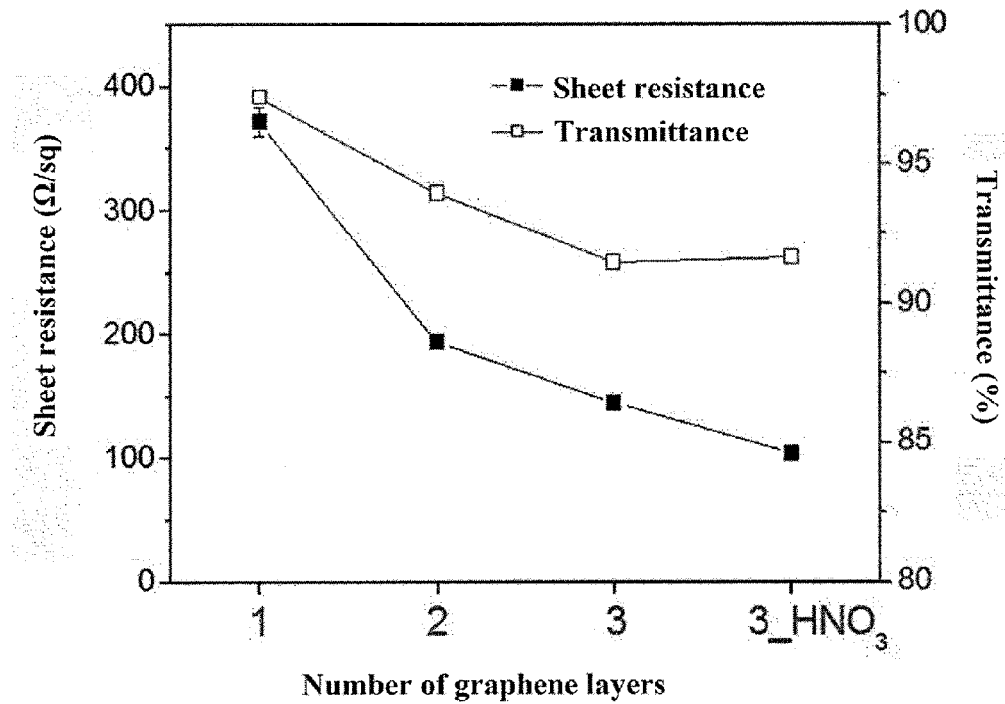
[Figure 15]
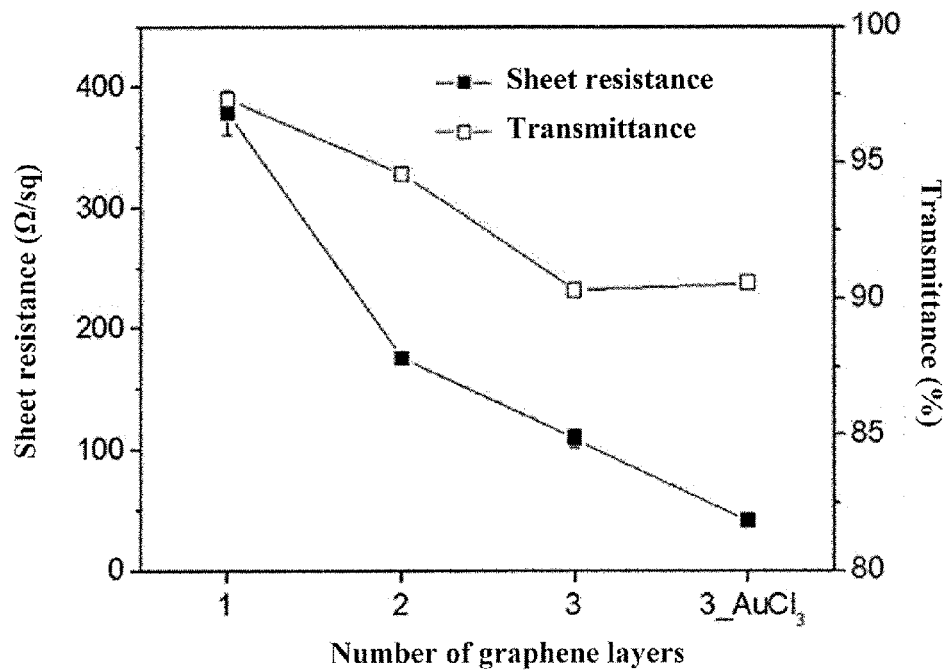

[Figure 16]
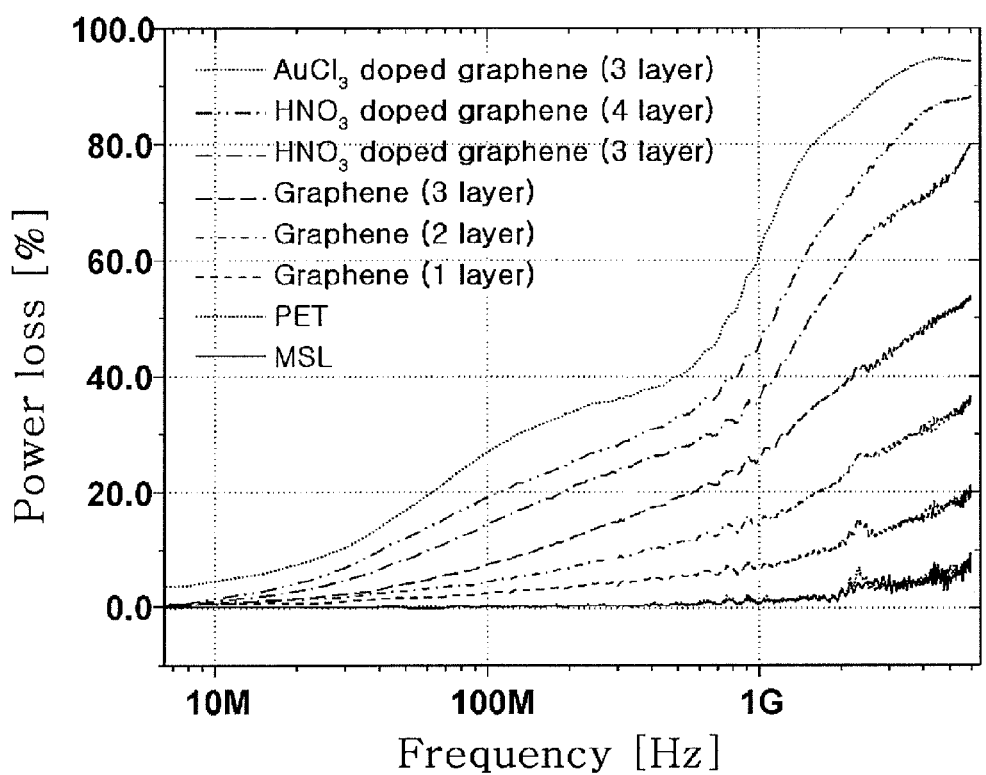

【Figure 17】
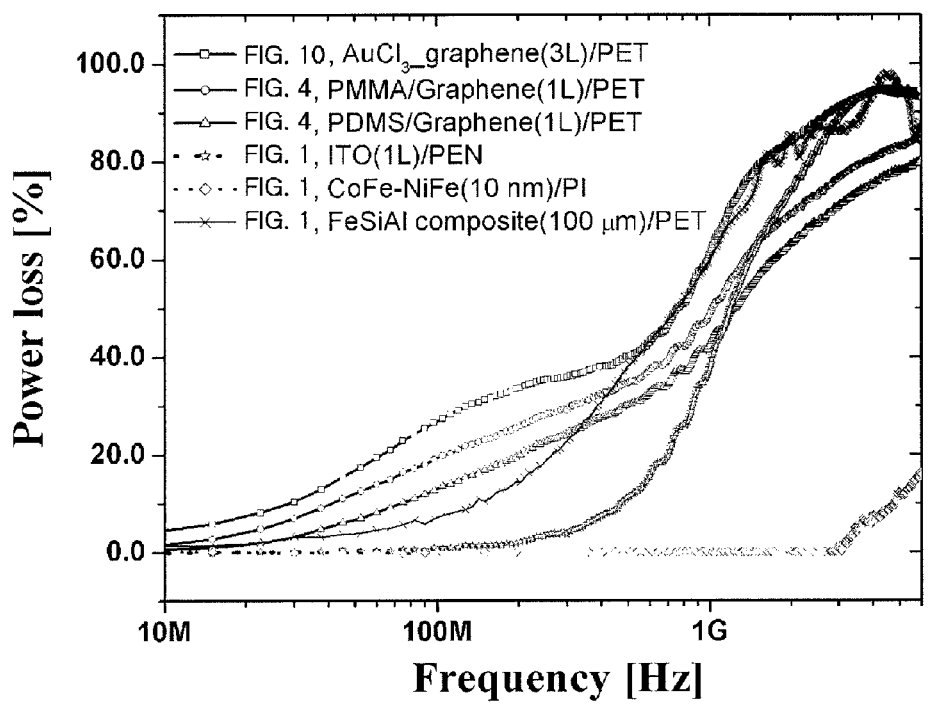

【Figure 18】
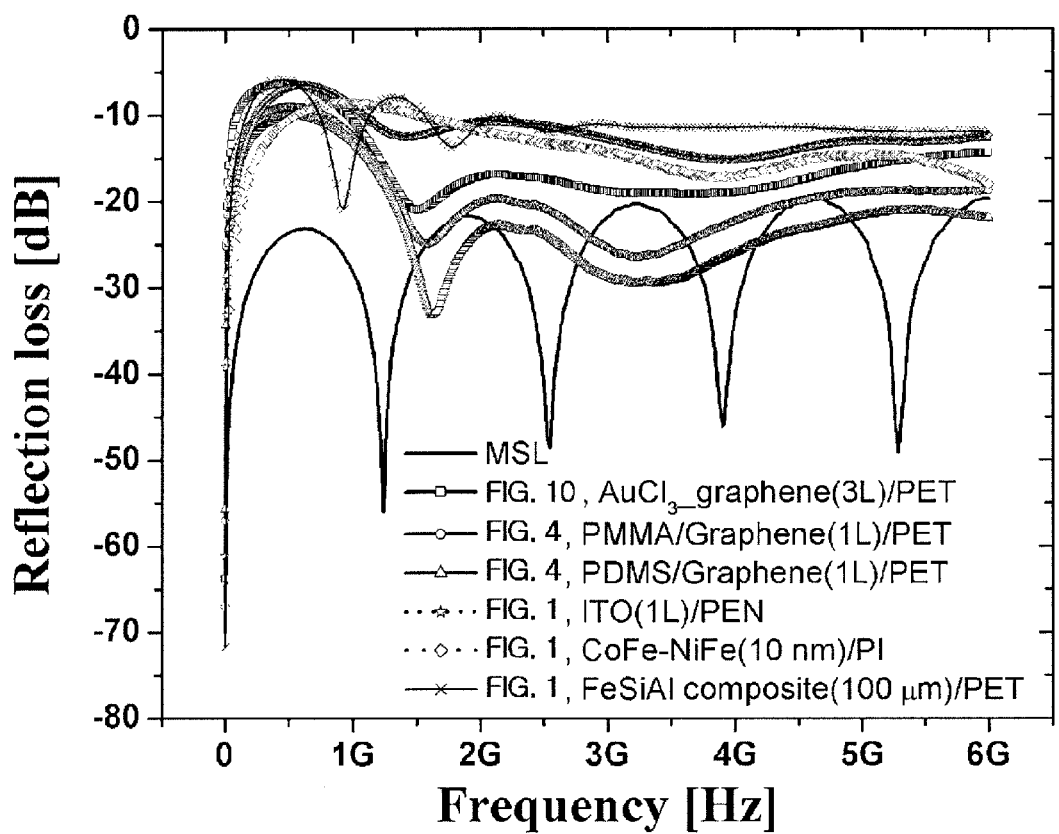

【Figure 19】
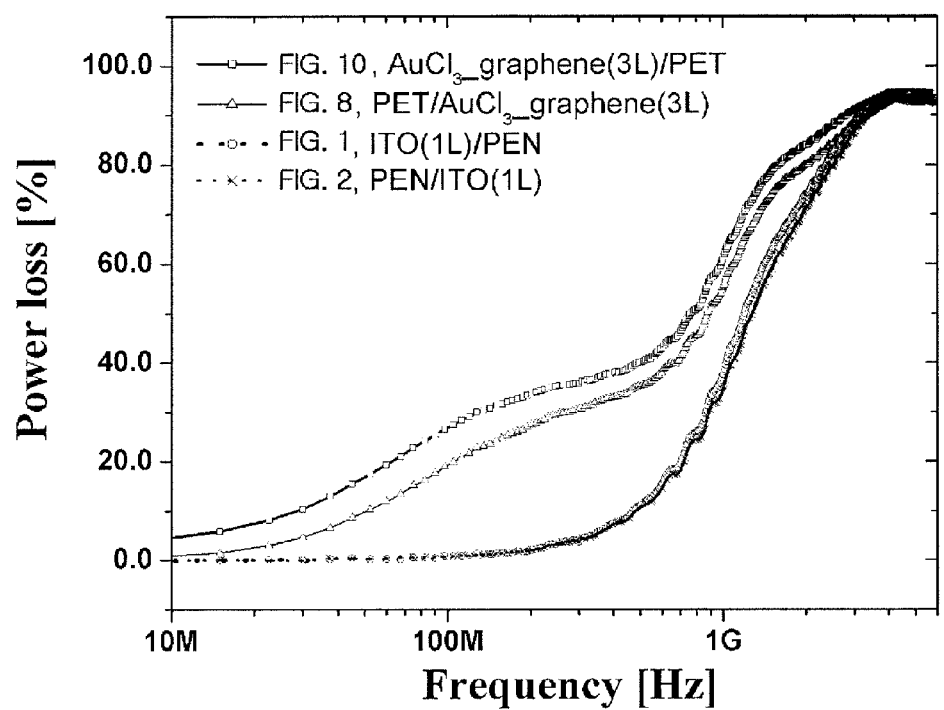

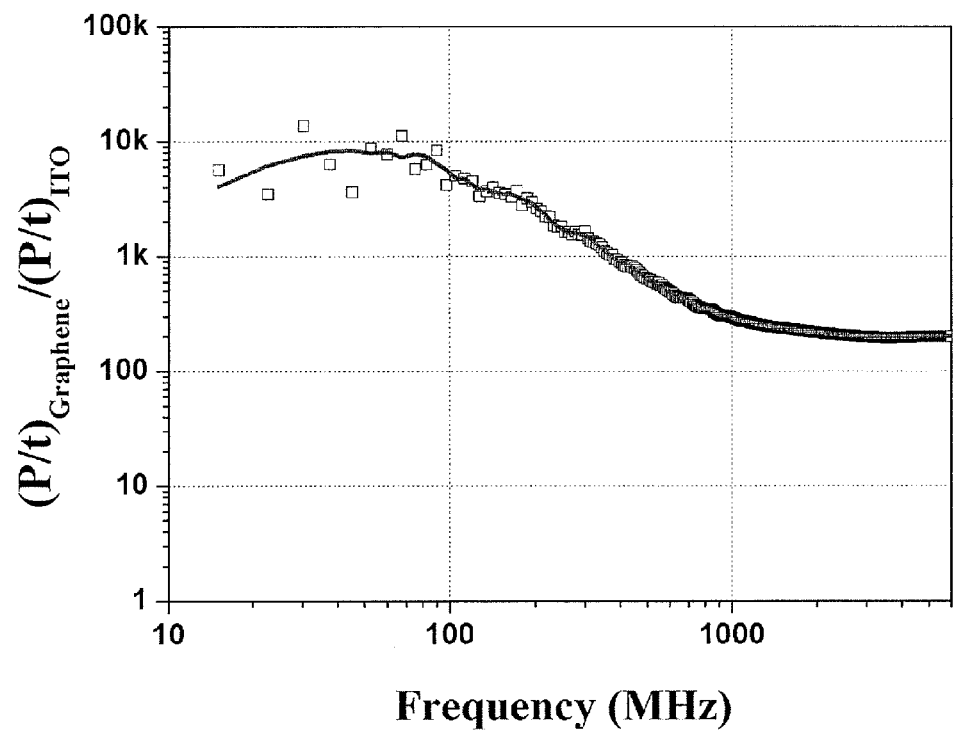
[Figure 20]

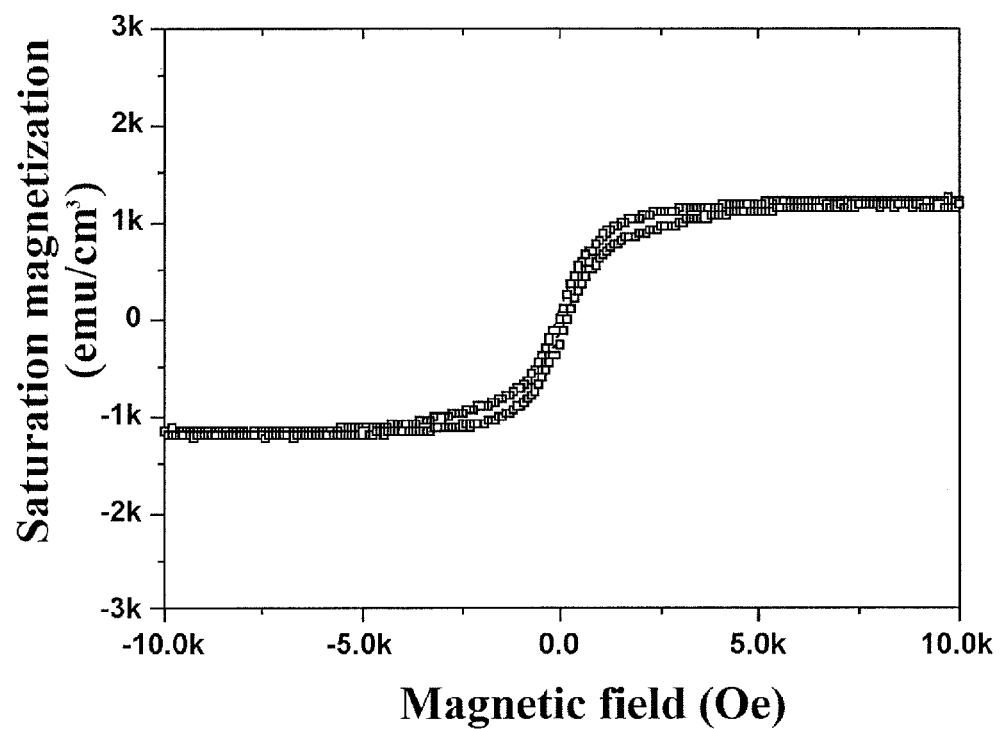
【Figure 21】

PASSIVE LAYER FOR ATTENUATION OF NEAR-FIELD ELECTROMAGNETIC WAVES AND HEATDISSIPATION INCLUDING GRAPHENE, AND ELECTROMAGNETIC DEVICE INCLUDING THE SAME

TECHNICAL FIELD

The present invention relates to a passive layer for the attenuation of near-field electromagnetic waves and heat dissipation including graphene, and an electromagnetic device including the passive layer.

BACKGROUND ART

In recent years, there has been increasing demands for rapid circuit signal processing, high frequency, high performance, miniaturization, and ultra-slimness of electronic elements in digital devices for various applications, such as automotive vehicles, mobiles, displays, and information electronics. Flexibility is further required in flexible electronic devices. In response to these demands, efforts have been made, for example, to highly integrate circuits in semiconductor devices. Thus, there is a tendency to hybridize dielectric noise-radiating active elements with passive elements. As a result of this hybridization, capacitive coupling and inductive coupling enhance cross talk, radiated noises interfere with each other, and heat is released, resulting in frequent malfunction of devices without normal operation. In some cases, noises in the near-field region, i.e., the distance between the radiation source and noise attenuation material is lower than the wavelength of the radiation ($\lambda/2\pi$), may interfere with each other. This interference often affects the operation of an external device.

Measures against noises and interference of electromagnetic waves in rapid-processing, high-performance, high-integration electromagnetic devices, particularly, measures against noises in the band of 100 MHz to 20 GHz, include many techniques, such as shielding, grounding, and installation of low-pass filters.

The typical shielding techniques include electrostatic shielding and magnetic shielding. The electrostatic shielding is associated with the use of an electrically conductive metal case (such as an aluminum or copper case), or a wire mesh or screen to block a far-field electric field radiated from the outside, while allowing free passage to magnetic fields. The magnetic shielding is associated with the use of a magnetic metal case with high magnetic permeability to shield a far-field magnetic field entering from or emitted to the outside. That is, the conventional shielding techniques are associated with the use of shielding materials capable of reflecting or absorbing far-field electromagnetic waves to block the far-field electromagnetic waves entering or exiting at the distance between the radiation source and shielding material greater than $\lambda/2\pi$. When noises are shielded by far-field shielding techniques, some of them are reflected and some are absorbed. The reflected noises and the absorbed noises coexist and are thus amplified. Accordingly, the shielding techniques cannot be used to suppress interference of near-field noises emitted from internal IC chips and circuits of devices. An excessively high reflectance of noises may also negatively affect peripheral circuits and an excessively high absorbance of noises may lead to signal reduction. Therefore, grounding or filtering techniques are employed to suppress interference of near-field noises.

The grounding techniques include frame grounding and signal grounding. According to the frame grounding, a metal case and a sash are grounded to the earth. According to the signal grounding, a metal case and a sash are grounded to a ground circuit board. The grounding techniques are designed to keep the impedance of earth circuits as low as possible and to minimize the ground loop area.

Finally, the EMI filtering techniques use combinations of passive elements such as inductance components and capacitance components. According to the EMI filtering techniques, noises are typically attenuated by using a power filter designed to withstand high voltage and current of 30 MHz or less and a signaling filter used in a current signaling system at 30 MHz or more.

However, the use of these elements is not suitable as an urgent measure against noises in devices with short life cycles because mounting spaces for the elements are required and miniaturization and slimness of the elements should be considered from the design stage. Inductance elements are also still very insufficient for use in the radio-frequency (RF) or semi-microwave band due to their low-frequency characteristics of the real component of permeability.

With the trend toward miniaturization of semiconductor devices and digital devices, there is a growing demand for ultra-slim/ultra-thin films and devices including the films for effectively controlling near-field noises and heat generated from adjacent noise sources inside an electronic device used in the RF or semi-microwave band. In view of this situation, sheets and films using ferrite or soft magnetic materials have been used to suppress electromagnetic waves. Such methods are based on noise reduction effect derived from magnetic loss. Insufficient permeability with increasing frequency limits ultra-slimness/ultra-thinness and lowers the frequency characteristics of the imaginary component of permeability, leading to a negligible noise reduction effect. Elements such as coils and filters may be used in the frequency bands lower than and higher than several tens of MHz to several hundreds of MHz. However, there are no elements that are convenient to use as measures against noises in the RF band. Even though some passive elements are known to be suitable as measures against noises, enormous costs are incurred, for example, in changing the design of substrates.

In order to solve such problems, there is a need for circuit devices and light-weight and thin films as measures for noise reduction/heat dissipation that can be applied to a wider range of frequency than magnetic sheets and are effective in noise reduction and heat dissipation even in the form of thin films. Particularly, methods for noise attenuation using a number of passive elements in devices such as semiconductor devices, smart phones, and flexible displays, which require smaller size and thickness and lighter weight, have difficulties in mounting the passive elements and in achieving slimness and heat dissipation due to the limited sizes of the passive elements. Under these circumstances, there is an urgent need to develop a noise attenuation film that is advantageous in nanodevice fabrication and high heat dissipation, and an electronic device including the film.

DISCLOSURE

Technical Problem

The present invention has been made in an effort to solve the above problems, and it is an object of the present invention to provide a film for the attenuation of electromagnetic waves and heat dissipation that can be applied to a wider range of frequency than a magnetic sheet and is effective in noise reduction and heat dissipation even in the form of a thin film.

Technical Solution

Aspects of the present invention provide a passive layer for the attenuation of near-field electromagnetic waves and heat dissipation which includes graphene, and an electromagnetic device including the passive layer.

Specifically, an aspect of the present invention provides an electromagnetic device including (a) a base, (b) one or more active layers, (c) one or more passive layers for the attenuation of near-field electromagnetic waves and heat dissipation including graphene, and (d) one or more low dielectric constant layers, wherein the passive layers for the attenuation of near-field electromagnetic waves and heat dissipation are in contact with the low dielectric constant layers, the base is in contact with one of the passive layers for the attenuation of near-field electromagnetic waves and heat dissipation, one of the low dielectric constant layers, or both of them, and one of the passive layers for the attenuation of near-field electromagnetic waves and heat dissipation is formed on the active layers, one of the low dielectric constant layers is formed on the active layers, or the active layers are surrounded by one of the low dielectric constant layers.

A further aspect of the present invention provides a circuit board including a substrate, a wiring layer formed on the upper surface of the substrate, an insulating polymer layer formed so as to cover the wiring layer, and a passive layer including graphene formed on the upper surface of the insulating polymer layer to attenuate near-field electromagnetic waves and dissipate heat.

Another aspect of the present invention provides a method for producing an electromagnetic device, the method including (A) supplying a carbon source and heat to a support foil for graphene growth including a metal catalyst to form a graphene layer on the support foil, (B) bringing a flexible substrate into contact with the graphene layer and rolling the resulting structure with an adhesive roller to form a first graphene sheet including the support foil for graphene growth, the graphene layer, and the flexible substrate, (C) dipping the first graphene sheet in an etching solution and passing the first graphene sheet through a roller to transfer the graphene layer to the flexible substrate while simultaneously removing the support foil for graphene growth by etching, to form a second graphene sheet including the graphene layer and the flexible substrate, and (D) bringing a target substrate into contact with the graphene layer of the second graphene sheet and rolling the resulting structure with a transfer roller to transfer the doped graphene layer to the target substrate.

Advantageous Effects

The flexible film for the attenuation of near-field electromagnetic waves and heat dissipation according to the present invention blocks electromagnetic waves radiated from an external electronic device or prevents electromagnetic waves generated in an electronic device from emitting to the outside. The flexible film of the present invention is designed to reduce interference between transmission circuits of a device in the near-field region or influence such as malfunction caused by external electromagnetic waves. The electromagnetic device or the circuit board of the present invention includes the flexible film.

Particularly, the graphene-based circuit device or flexible film for noise attenuation is characterized by the formation of a near-field noise attenuation layer including a graphene layer and a dielectric insulating layer on the surface of an electromagnetic circuit that may take various forms, the formation of a passive layer for the attenuation of near-field electromagnetic waves and heat dissipation having a multilayer composite structure including a dielectric insulating layer, a graphene nanolayer and a dielectric insulating layer, or the formation of a passive layer for the attenuation of near-field electromagnetic waves and heat dissipation by embedding a graphene layer and an insulating layer inside a flexible polymer film, a semiconductor circuit, or a rigid or flexible circuit board. In addition, the circuit device or the flexible film of the present invention can effectively reduce noise and can remove heat due to its very high thermal conductivity, achieving slimness and high integration simultaneously.

The graphene-based passive layer for attenuation of near-field electromagnetic waves and heat dissipation and the electronic device including the passive layer are flexible and can exhibit high heat dissipation and light transmission characteristics, which have been unachievable in conventional materials such as magnetic films and CNTs. The passive layer of the present invention effectively absorbs electromagnetic waves in the RF or semi-microwave band despite the very small thickness (2 nm or less) of several layers. Due to these advantageous effects, the passive layer of the present invention is applicable to transparent films for noise attenuation and various types of electronic devices including the transparent films. In the near future, the passive layer of the present invention is expected to contribute to the fabrication of thin film devices and nanodevices.

DESCRIPTION OF DRAWINGS

FIG. 1 is a schematic view of a film for the attenuation of near-field electromagnetic waves and heat dissipation including a multilayer passive layer for the attenuation of electromagnetic waves and heat dissipation consisting of a graphene or noise attenuation layer 4 and a polymer layer 3 on embedded transmission lines 5 of a metal, ceramic or polymer film with ground or a circuit substrate 1 or 2, and an electronic device or a rigid-flexible circuit board with a small gap of insulator including the film (In FIGS. 1 thru 12, ground line, which may be located under the circuit substrate has been omitted);

FIG. 2 is a schematic view of a film for the attenuation of near-field electromagnetic waves and heat dissipation including a multilayer passive layer for the attenuation of electromagnetic waves and heat dissipation consisting of a polymer layer and a graphene layer on transmission lines 5 of a metal, ceramic or polymer film or a circuit substrate 1 or 2, and an electronic device or a rigid-flexible circuit board with a small gap of insulator including the film;

FIG. 3 is a schematic view of a film for the attenuation of near-field electromagnetic waves and heat dissipation including a multilayer passive layer for the attenuation of electromagnetic waves and heat dissipation consisting of a low dielectric constant layer, a graphene layer, and a polymer layer on transmission lines 5 of a metal, ceramic or polymer film or a circuit substrate 1 or 2, and an electronic device or a rigid-flexible circuit board with a small gap of insulator including the film;

FIG. 4 is a schematic view of a film for the attenuation of near-field electromagnetic waves and heat dissipation including a multilayer passive layer for the attenuation of electromagnetic waves and heat dissipation consisting of a low dielectric constant layer, a graphene layer, a doped graphene layer, and a polymer layer on transmission lines 5 of a metal, ceramic or polymer film or a circuit substrate 1 or 2, and an electronic device or a rigid-flexible circuit board with a small gap of insulator including the film;

FIG. 5 is a schematic view of a film for the attenuation of near-field electromagnetic waves and heat dissipation including an embedded passive layer for the attenuation of electromagnetic waves and heat dissipation in which a graphene layer 4 is formed on a metal, ceramic or polymer film or a substrate 1 or 2, and a polymer insulating layer 3 and transmission lines are disposed on the graphene layer, and an electronic device or a rigid-flexible circuit board with a small gap of insulator including the film;

FIG. 6 is a schematic view of a film for the attenuation of near-field electromagnetic waves and heat dissipation including an embedded passive layer for the attenuation of electromagnetic waves and heat dissipation in which a low dielectric adhesive layer 3b and a graphene layer 4 are formed on a metal, ceramic or polymer film or a circuit substrate 1 or 2, and a polymer insulating layer 3a and transmission lines are disposed on the graphene layer, and an electronic device or a rigid-flexible circuit board with a small gap of insulator including the film;

FIG. 7 is a schematic view of a film for the attenuation of near-field electromagnetic waves and heat dissipation including an embedded passive layer for the attenuation of electromagnetic waves and heat dissipation in which a graphene layer 4b is formed on a metal, ceramic or polymer film or a circuit substrate 1 or 2, a polymer insulating layer 3b and transmission lines are disposed on the graphene layer, a graphene layer 4a is formed thereon, and a protective insulating layer 3a is formed on the graphene layer 4a, and an electronic device or a rigid-flexible circuit board with a small gap of insulator including the film;

FIG. 8 is a schematic view of a film for the attenuation of near-field electromagnetic waves and heat dissipation including a multilayer passive layer for the attenuation of electromagnetic waves and heat dissipation consisting of laminates, each of which includes a low dielectric constant layer, a graphene layer, a doped graphene layer, and a polymer layer, on transmission lines 5 of a metal, ceramic or polymer film or a circuit substrate 1 or 2, and an electronic device or a rigid-flexible circuit board with a small gap of insulator including the film;

FIG. 9 is a schematic view of an electronic device or a rigid-flexible circuit board including a multilayer laminate structure of films or substrates, each of which has a passive layer for the attenuation of electromagnetic waves and heat dissipation in which a low dielectric adhesive layer 3 and transmission lines are disposed on a metal, ceramic or polymer film or a circuit substrate 1 or 2, and a plurality of graphene layers 4a and 4b are formed thereon;

FIG. 10 is a schematic view of a film for the attenuation of near-field electromagnetic waves and heat dissipation including a plurality of passive layers for the attenuation of electromagnetic waves and heat dissipation, each of which has an embedded structure in which transmission lines on a metal, ceramic or polymer film 1 or 2 are surrounded by patterned low dielectric constant layers 3, a plurality of graphene layers 4a and 4b are formed thereon, and a polymer insulating layer 3 is formed thereon, and an electronic device or a rigid-flexible circuit board including the film;

FIG. 11 is a schematic view of a film for the attenuation of near-field electromagnetic waves and heat dissipation including a plurality of passive layers for the attenuation of electromagnetic waves and heat dissipation, each of which has an embedded structure in which transmission lines on a metal, ceramic or polymer film 1 or 2 are surrounded by patterned low dielectric constant layers 3, a plurality of graphene layers 4a and 4b are formed thereon, and a polymer insulating layer 3 is formed thereon, and an electronic device or a rigid-flexible circuit board including the film;

FIGS. 12 and 13 are schematic diagrams of a graphene preparation process using a chemical vapor deposition (CVD) system and a related transfer process thereof;

FIGS. 14 and 15 show sheet resistance and transmittance curves of graphene and doped graphene transferred to polymer films depending on the number of the graphene layers, respectively;

FIG. 16 shows power loss curves evaluating the effects of passive layers (each 50×50 mm) including graphene, which were formed on transmission lines by a microstrip line method, on the attenuation of near-field electromagnetic waves between the transmission lines having a characteristic impedance of 50 Ω;

FIGS. 17 and 18, respectively show the frequency dependency of power loss ($P_{loss}/P_{in}$) and reflection loss between transmission lines, which were measured on the doped graphene (3-layer)/PET structure of FIG. 8, the PMMA or PDMS/graphene/PET structure of FIG. 4, the 15Ω/□ ITO/PEN structure of FIG. 1, the 10 nm thick CoFe—NiFe soft magnetic layer/PI layer structure of FIG. 1, and the FeSiAl composite/PET structure of FIG. 1, each of which was formed on the transmission lines by a microstrip line method to have an area of 50×50 mm, and reflection loss ($S_{11}$) of the structures;

FIG. 19 is a graph comparing power losses ($P_{loss}/P_{in}$) between transmission lines, which were measured on the doped graphene (3-layer)/PET structures of FIGS. 2, 8 and 10 and the 15Ω/□ ITO/PEN structures of FIGS. 1 and 2, each of which was formed on the transmission lines by a microstrip line method to have an area of 50×50 mm;

FIG. 20 is a graph showing the ratios (($P/t)_{graphene}/(Pt)_{ITO}$) of the power loss-to-thickness ratios (($P/t)_{graphene}$) of the AuCl$_3$ doped graphene (3-layer)/PET film structure of FIGS. 2 and 8 to the power loss-to-thickness ratios (($Pt)_{ITO}$) of the 15Ω/□ ITO/PEN structure of FIG. 2; and FIG. 21 is a graph showing the magnetic moments of graphene (1-layer) measured using a superconducting quantum interference device (SQUID) magnetometer.

BEST MODE

Reference will now be made in detail to embodiments of the present invention, examples of which are illustrated in the accompanying drawings, in such a manner that the present invention can be easily carried out by a person having ordinary skill in the art to which the present invention pertains. However, the present invention is not limited to the illustrated embodiments and examples and may be embodied in various different forms.

The present invention provides a graphene-based film for the attenuation of near-field electromagnetic waves and heat dissipation that has high thermal conductivity (~5,000 W/mK), mechanical strength (1,060 GPa), and high transmittance, and a device including the film.

The present invention also provides a device or film for the attenuation of near-field electromagnetic waves and heat dissipation which includes a passive layer for the attenuation of near-field electromagnetic waves and heat dissipation consisting of a dielectric polymer layer and a graphene layer on or inside a polymer film or on or inside a silicon circuit device, signaling lines of a PCB or a noise source. The present invention also provides a flexible element or film for attenuation of near-field noise, as a measure against noise from a rigid or flexible board or device, that has a multilayer structure of one or more graphene layers and one or more dielectric polymer layers on a polymer film.

Specifically, one aspect of the present invention provides a passive layer for the attenuation of near-field electromagnetic waves and heat dissipation which includes graphene. Another aspect of the present invention provides an electromagnetic device including a passive layer for the attenuation of near-field electromagnetic waves and heat dissipation including graphene. In one embodiment, the electromagnetic device may be selected from thin film devices, nanodevices, semiconductor devices, memory devices, molecular devices, optical devices, display devices, digital devices, and devices including a rigid or flexible substrate.

The term "active layer" used herein refers to a layer that functions to directly drive the device. The term "passive layer" used herein refers to a layer that does not directly function to drive the device but indirectly affects the driving of the active layer. Particularly, the term "passive layer for the attenuation of near-field electromagnetic waves and heat dissipation" used herein refers to a layer that functions to prevent electromagnetic waves generated in the two or more active layers of the electromagnetic device from interfering with each other, thus indirectly affecting the driving of the active layers without noise interference.

A further aspect of the present invention provides an electromagnetic device including (a) a base, (b) one or more active layers, (c) one or more passive layers for the attenuation of near-field electromagnetic waves and heat dissipation including graphene, and (d) one or more low dielectric constant layers, wherein the passive layers for the attenuation of near-field electromagnetic waves and heat dissipation are in contact with the low dielectric constant layers, the base is in contact with one of the passive layers for the attenuation of near-field electromagnetic waves and heat dissipation, one of the low dielectric constant layers, or both of them, and one of the passive layers for the attenuation of near-field electromagnetic waves and heat dissipation is formed on the active layers, one of the low dielectric constant layers is formed on the active layers, or the active layers are surrounded by one of the low dielectric constant layers.

The term "low dielectric constant layers" used herein is a concept including layers called "insulating layers" and "protective insulating layers" in the art to which the present invention pertains. Particularly, the low dielectric constant layers are layers that have a relative permittivity in the range of 1 to 20 and are composed of a material selected from inorganic materials, polymers, and organic molecules. The low dielectric constant layers are particularly preferably selected from oxide layers, nitride layers, carbide layers, and polymer layers.

The passive layers for the attenuation of near-field electromagnetic waves and heat dissipation may be undoped or doped with either an organic dopant or an inorganic dopant or both of them. The base is preferably selected from metal bases, ceramic bases, polymer bases, silicon bases, flexible circuit substrates, rigid circuit substrates, and flexible films. The active layers are selected from signal circuit lines, ground circuit lines, transmission circuit lines, electrodes, semiconductor layers, and memory layers. The electromagnetic device is preferably selected from thin film devices, nanodevices, semiconductor devices, memory devices, molecular devices, optical devices, display devices, digital devices, and devices including a rigid or flexible substrate.

The base may be in contact with one of the passive layers for the attenuation of near-field electromagnetic waves and heat dissipation and one of the low dielectric constant layers. In this case, one of the passive layers for the attenuation of near-field electromagnetic waves and heat dissipation may be formed on only a portion of the surface of the base, and one of the low dielectric constant layers may be formed both on the upper surface of the passive layer for the attenuation of near-field electromagnetic waves and heat dissipation formed on the portion of the surface of the base and on the remaining portion of the surface of the base on which the passive layer is not formed. Alternatively, one of the low dielectric constant layers may be formed on only a portion of the surface of the base, and one of the passive layers may be formed both on the upper surface of the low dielectric constant layer formed on the portion of the surface of the base and on the remaining portion of the surface of the base on which the low dielectric constant layer is not formed. This embodiment is partially illustrated in FIG. 11.

According to a further embodiment, an electromagnetic device is provided in which at least some of the active layers (b) including microstrip or coplanar waveguide circuits are formed on portions of the upper surface of the base (a) with a ground layer, one of the passive layers (c) for the attenuation of near-field electromagnetic waves and heat dissipation is formed on the upper portions of the some of the active layers and the remaining portion of the upper surface of the base on which the some active layers are not formed, and one of the low dielectric constant layers (d) is formed on the upper surface of the passive layer. This embodiment is schematically illustrated in FIG. 1.

According to a further embodiment, an electromagnetic device is provided in which at least some of the active layers (b) are formed on portions of the upper surface of the base (a) with a ground layer, one of the low dielectric constant layers (d) is formed on the upper portions of the some active layers and the remaining portion of the upper surface of the base on which the some active layers are not formed, and one of the passive layers for the attenuation of near-field electromagnetic waves and heat dissipation is formed on the upper surface of the low dielectric constant layer. This embodiment is schematically illustrated in FIG. 2.

According to another embodiment, an electromagnetic device is provided in which another layer of the low dielectric constant layers (d) is further formed on the passive layer for the attenuation of near-field electromagnetic waves and heat dissipation formed on the upper surface of the low dielectric constant layer. This embodiment is schematically illustrated in FIG. 3.

According to another embodiment, an electromagnetic device is provided in which the passive layer for the attenuation of near-field electromagnetic waves and heat dissipation formed on the upper surface of the low dielectric constant layer is a composite passive layer for the attenuation of near-field electromagnetic waves and heat dissipation consisting of two or more passive layers for the attenuation of near-field electromagnetic waves and heat dissipation, and the two or more passive layers for the attenuation of near-field electromagnetic waves and heat dissipation are doped with a dopant. This embodiment is schematically illustrated in FIG. 4.

According to another embodiment, an electromagnetic device is provided in which a further composite passive layer for the attenuation of near-field electromagnetic waves and heat dissipation is formed on the upper surface of the low dielectric constant layer formed on the passive layer for the attenuation of near-field electromagnetic waves and heat dissipation, and a further low dielectric constant layer is formed on the upper surface of the further composite passive layer for the attenuation of near-field electromagnetic waves and heat dissipation. This embodiment is schematically illustrated in FIG. 8.

According to one embodiment of the present invention, an electromagnetic device is provided in which one of the passive layers (c) for the attenuation of near-field electromagnetic waves and heat dissipation is formed on the upper surface of the base (a), and at least some of the active layers (b) and at least one layer of the low dielectric constant layers (d) with a small gap of insulator surrounding the some active layers are formed on the passive layer for the attenuation of near-field electromagnetic waves and heat dissipation. This embodiment is schematically illustrated in FIG. 5.

According to a further embodiment, an electromagnetic device is provided in which another layer of the passive layers for the attenuation of near-field electromagnetic waves and heat dissipation is formed on the upper surface of the low dielectric constant layer formed on the passive layer, and another layer of the low dielectric constant layers is formed on the upper surface of the another passive layer for the attenuation of near-field electromagnetic waves and heat dissipation. This embodiment is schematically illustrated in FIG. 7.

According to a further embodiment of the present invention, an electromagnetic device is provided in which one of the low dielectric constant layers (d) is formed on the upper surface of the base (a), one of the passive layers (c) for the attenuation of near-field electromagnetic waves and heat dissipation is formed on the upper surface of the low dielectric constant layer, and at least some of the active layers (b) and at least one layer of the low dielectric constant layers (d) surrounding the active layers are formed on the passive layer for the attenuation of near-field electromagnetic waves and heat dissipation. This embodiment is schematically illustrated in FIG. 6.

According to another embodiment of the present invention, an electromagnetic device is provided in which at least some of the active layers (b) and at least one layer of the low dielectric constant layers (d) surrounding the active layers are formed on the upper surface of the base (a), one of the passive layers (c) for the attenuation of near-field electromagnetic waves and heat dissipation is formed on the upper surface of the low dielectric constant layer, the passive layer for the attenuation of near-field electromagnetic waves and heat dissipation formed on the upper surface of the low dielectric constant layer is a composite passive layer for the attenuation of near-field electromagnetic waves and heat dissipation consisting of two or more passive layers for the attenuation of near-field electromagnetic waves and heat dissipation, and the two or more passive layers for the attenuation of near-field electromagnetic waves and heat dissipation are doped with a dopant. This embodiment is schematically illustrated in FIG. 9.

According to another embodiment of the present invention, an electromagnetic device is provided in which a further low dielectric constant layer is formed on the upper surface of the composite passive layer for the attenuation of near-field electromagnetic waves and heat dissipation, and a further composite passive layer for the attenuation of near-field electromagnetic waves and heat dissipation is formed on the upper surface of the further low dielectric constant layer. This embodiment is also schematically illustrated in FIG. 9.

According to one embodiment of the present invention, an electromagnetic device is provided in which the passive layer for the attenuation of near-field electromagnetic waves and heat dissipation is a composite passive layer for the attenuation of near-field electromagnetic waves and heat dissipation consisting of two or more passive layers, and the active layers are surrounded by another low dielectric constant layer. This embodiment is schematically illustrated in FIG. 10.

According to another aspect of the present invention, there is provided a circuit board including a substrate, a wiring layer formed on the upper surface of the substrate, an insulating polymer layer formed so as to cover the wiring layer, and a passive layer including graphene formed on the upper surface of the insulating polymer layer to attenuate near-field electromagnetic waves and dissipate heat.

The graphene layer acts to absorb or attenuate near-field noises radiated from the wiring layer. The insulating polymer layer acts to adhere and protect the graphene. Polyimide is a particularly preferred material for the insulating polymer layer.

As discussed above, FIGS. 1 to 11 exemplarily illustrate the structures of the circuit boards or films for the attenuation of near-field electromagnetic waves and heat dissipation according to several aspects and embodiments of the present invention.

FIGS. 1, 2, and 3 illustrate films for the attenuation of near-field electromagnetic waves and heat dissipation including a multilayer passive layer for the attenuation of electromagnetic waves and heat dissipation consisting of a graphene layer 4 and a polymer layer 3, a multilayer passive layer for the attenuation of electromagnetic waves and heat dissipation consisting of a polymer layer and a graphene layer, and a multilayer passive layer for the attenuation of electromagnetic waves and heat dissipation consisting of a low dielectric constant layer, a graphene layer, and a polymer layer, respectively, on transmission lines 5 of a metal, ceramic or polymer film or a circuit substrate 1 or 2. FIGS. 1, 2, and 3 further illustrate thin film devices, nanodevices, semiconductor devices, rigid circuit boards, and flexible circuit boards including the films. FIG. 4 illustrates a film for the attenuation of near-field electromagnetic waves and heat dissipation including a multilayer passive layer for the attenuation of electromagnetic waves and heat dissipation in which a low dielectric constant layer is disposed on a metal, ceramic or polymer film or a circuit substrate 1 or 2 including transmission lines, a plurality of doped graphene layers 4a and 4b are disposed on the low dielectric constant layer, and a protective insulating layer is coated thereon, and a thin film device, a nanodevice, a semiconductor device, a rigid circuit board or a flexible circuit board including the film.

FIG. 5 illustrates an embedded film for the attenuation of near-field electromagnetic waves and heat dissipation in which a graphene layer 4 is formed on a metal, ceramic or polymer film or a circuit substrate 1 or 2, and a polymer insulating layer 3a and transmission lines are disposed on the graphene layer, and a thin film device, a nanodevice, a semiconductor device or a rigid circuit board or a flexible circuit board including the film. FIG. 6 illustrates an embedded film for the attenuation of near-field electromagnetic waves and heat dissipation in which a low dielectric adhesive layer 3b and a graphene layer 4 are formed on a metal, ceramic or polymer film or a circuit substrate 1 or 2, and a polymer insulating layer 3a and transmission lines are disposed on the graphene layer, and a thin film device, a nanodevice, a semiconductor device or a rigid circuit board or a flexible circuit board including the film.

FIG. 7 illustrates a composite embedded film for the attenuation of near-field electromagnetic waves and heat dissipation in which a doped graphene layer 4b is transferred to a metal, ceramic substrate or polymer film 1 or 2, a polymer insulating layer 3b and transmission lines are disposed on the graphene layer, and a graphene layer 4a and a polymer protective layer 3a are formed thereon, and a thin film device, a nanodevice, a semiconductor device or a rigid circuit board or a flexible circuit board including the film. FIG. 8 illustrates a film for the attenuation of near-field electromagnetic waves and heat dissipation in which multilayer structures, each of which includes a low dielectric constant layer, doped graphene layers 4a and 4b, and a protective insulating layer, as illustrated in FIG. 4, are coated on a metal, ceramic or polymer film or a circuit substrate 1 or 2, and a thin film device, a nanodevice, a semiconductor device or a rigid circuit board or a flexible circuit board including the film.

FIG. 9 illustrates a thin film device, a nanodevice, a semiconductor device, a rigid circuit board or a flexible circuit board having a multilayer laminate structure of devices or circuit boards, each having the structure illustrated in FIG. 4. FIG. 10 illustrates a film for the attenuation of near-field electromagnetic waves and heat dissipation including a laminate of a plurality of embedded passive layers for the attenuation of electromagnetic waves and heat dissipation, each of which has a structure in which transmission lines on a metal, ceramic or polymer film 1 or 2 are surrounded by patterned low dielectric constant layers 3, a plurality of graphene layers 4a and 4b are formed thereon, and a polymer insulating layer 3 is formed thereon, and a thin film device, a nanodevice, a semiconductor device, a rigid circuit board or a flexible circuit board including the film. FIG. 11 illustrates a thin film device, a nanodevice, a semiconductor device, a rigid circuit board or a flexible circuit board having a structure for the attenuation of near-field noise in which transmission lines on a metal, ceramic substrate or polymer film 1 or 2 are surrounded by patterned low dielectric constant layers 3, a plurality of patterned graphene layers 4a and 4b are formed thereon, and a protective layer having low dielectric insulation performance and high scratch resistance is formed thereon.

In the film for the attenuation of near-field electromagnetic waves and heat dissipation or the thin film device, nanodevice, semiconductor device, rigid circuit board or flexible circuit board including the film designed in the present invention, a plurality of organic-inorganic hybrid thin film layers for noise attenuation are arranged under or on a noise-radiating circuit or wiring. With this arrangement, the film of the present invention is effective as a measure against noises from a multilayer circuit device or a multilayer integrated circuit device and can make the multilayer circuit device or multilayer integrated circuit device ultra-slim. Furthermore, when applied to a flexible circuit board, the film of the present invention has good adhesion to a polyimide base, achieving excellent bending properties without the need for an additional adhesive layer.

Another aspect of the present invention provides a method for producing the thin film circuit board or the film for the attenuation of near-field electromagnetic waves and heat dissipation. The circuit boards or the films for the attenuation of near-field electromagnetic waves in the RF or semi-microwave band and heat dissipation according to several aspects and several embodiments can be produced by transferring a graphene layer to a silicon circuit board, a rigid or flexible circuit board or a film outside or inside an electromagnetic wave source by chemical vapor deposition, but the production of the circuit boards or films is not limited thereto.

In several aspects and several embodiments of the present invention, the base may be a flexible base, particularly a flexible transparent base. The base may include a metal or polymer. The graphene layer may be chemically doped. The sheet resistance of the graphene layer may be 50 Ω/sq or less but is not limited thereto.

According to one embodiment, there is provided a method for forming a graphene layer on a base of each of the films for the attenuation of near-field electromagnetic waves and heat dissipation and the thin film devices, nanodevices, the semiconductor device, the rigid circuit boards, and the flexible circuit boards including the films according to the embodiments of the present invention. Specifically, the method includes (A) forming a graphene layer on a support foil for graphene growth including a metal catalyst by chemical vapor deposition, (B) bringing a flexible substrate into contact with the graphene layer and adhering the flexible substrate to the graphene layer by a roll-to-roll process using a first roll-to-roll system to form a laminate of the support foil for graphene growth, the graphene layer, and the flexible substrate, and (C) dipping the laminate in an etching solution and passing the laminate through a second roll-to-roll system to transfer the graphene layer to the flexible substrate while simultaneously removing the support foil for graphene growth by etching.

For example, the transfer may be repeated once or more to form graphene layers on the flexible substrate. For example, 1 to 100 graphene layers may be transferred to the flexible substrate.

According to an exemplary embodiment of the present invention, the process for the formation of the graphene layer on the base and a related transfer process thereof include rolling the graphene layer formed on the flexible substrate and a target substrate in contact with the flexible substrate using a transfer roller to transfer the graphene layer to the target substrate. More specifically, the processes may include the following four steps: (A) forming a graphene layer on a support foil for graphene growth including a carbonization catalyst, (B) rolling the graphene layer and a flexible substrate in contact with the graphene layer using an adhesive roller to form a laminate of the support foil for graphene growth, the graphene layer, and the flexible substrate, (C) dipping the laminate in an etching solution and passing the laminate through a roller to transfer the graphene layer to the flexible substrate while simultaneously removing the support foil for graphene growth by etching, and (D) bringing a target substrate into contact with the graphene layer and rolling the resulting structure with a transfer roller to transfer the graphene layer to the target substrate.

The support foil for graphene growth may further include a metal catalyst for graphene growth and optionally an underlying substrate. In an exemplary embodiment, the metal catalyst for graphene growth may include at least one of Ni, Co, Fe, Pt, Au, Al, Cr, Cu, Mg, Mn, Rh, Si, Ta, Ti, W, U, V, and Zr but is not limited thereto. The metal foil may be in the form of a roll. Preferably, the support foil for graphene growth has sufficient flexibility suitable for use in a roll-to-roll process employed in the present invention. As a non-limiting example, the graphene foil may have a large area with a transverse or longitudinal length of 1 mm to 1000 m.

In the present invention, the graphene layer may be easily grown on a large area at ambient pressure and coated by a roll-to-roll process. In an exemplary embodiment of the present invention, graphene may be grown on the support foil for graphene growth including the metal catalyst for graphene growth by using helium (He) as a carrier gas at ambient pressure instead of under vacuum. This can minimize damage to graphene caused by collision with heavier argon (Ar) at high temperature.

The carbon source may be, for example, carbon monoxide, methane, ethane, ethylene, ethanol, acetylene, propane, butane, butadiene, pentane, pentene, cyclopentadiene, hexane, cyclohexane, benzene, or toluene. The gas-phase carbon source is supplied and heated to a temperature of 300 to 2,000° C. As a result, carbon atoms present in the carbon source bond together to form graphene having a planar hexagonal structure.

According to the method for graphene layer formation, a graphene layer having a homogeneous structure substantially free of defects can be formed. The graphene layer may be a monolayer or multilayer of graphene. As a non-limiting example, the number of the graphene layers may be adjusted to 1 to 100. The roll-to-roll coating process for graphene layer formation may be repeated to form a plurality of graphene layers, as explained above.

The flexible substrate may have a pressure sensitive adhesive layer. A non-limiting material for the pressure sensitive adhesive layer is a thermal release polymer, a low density polyethylene, a low molecular weight polymer, a high molecular weight polymer, and a UV or infrared curable polymer. Specific examples of materials suitable for use in the pressure sensitive adhesive layer include PDMS, all kinds of polyurethane films, environmentally friendly adhesives and pressure sensitive adhesives such as water-based pressure sensitive adhesives, water soluble pressure sensitive adhesives, vinyl acetate emulsion adhesives, hot-melt adhesives, photocurable (UV, visible, electron beam, and UV/EB curable) adhesives, NOA adhesives, and highly heat resistant adhesives such as polybenzimidazole (PBI), polyimide (PI), silicone/imide, bismaleimide (BMI), and modified epoxy resins. Various general adhesive tapes may also be used.

The etching solution is an aqueous solution capable of selectively etching the support foil layer for graphene growth including the metal catalyst for graphene growth. Example of suitable etching solutions include, but are not limited to, HF, BOE, $Fe(NO_3)_3$, iron (III) chloride ($FeCl_3$), and $(NH_4)_2S_2O_8$.

By this process, a large area of the graphene layer can be coated on the flexible substrate from the support for graphene growth, and a barrier of the graphene layer can be easily coated on the target substrate at reduced cost in a short time.

The graphene layer coated on the target substrate by the process is flexible and has excellent mechanical properties and improved gas and moisture barrier properties.

In exemplary embodiments, the graphene layer may be transferred to and coated on the previously prepared flexible substrate through a dry or wet transfer method. The dry transfer method uses a polymer film or stamp. The wet transfer method is carried out by floating the graphene layer on water and upwardly raising the flexible substrate or downwardly stamping the flexible substrate on the graphene layer. More preferably, a large area of the flexible substrate can be coated in a short time through a coating method using a roll-to-roll process. The transfer process may be repeated to form one or more graphene layers on the flexible substrate. The multilayer structure of graphene layers can compensate for defects of the single graphene layer.

A further embodiment of the present invention is directed to a method for chemically doping a graphene layer on a base of each of the films for the attenuation of near-field electromagnetic waves and heat dissipation and the electronic devices including the films according to the present invention by roll-to-roll doping. The method includes dipping a graphene layer in an etching solution containing a dopant and passing the graphene layer through the etching solution by a roll-to-roll process or evaporating the doping solution and passing the graphene layer through the dopant vapor. Specifically, the graphene layer can be doped by dipping the graphene layer in an etching solution containing a dopant and passing the graphene layer through the etching solution by a roll-to-roll process. Alternatively, the graphene layer can be doped by evaporating the doping solution and passing the graphene layer through the dopant vapor by a roll-to-roll process to allow the graphene layer to come into contact with the dopant gas.

According to the present invention, two or more graphene layers can be transferred to and laminated on the substrate by a roll-to-roll process to enable self-doping of graphene. The substrate is not limited so long as it has transparency, flexibility, stretchability or a combination thereof.

For example, the single or plurality of graphene layers may be doped with an organic dopant and/or an inorganic dopant by a roll-to-roll process. Examples of suitable dopants include, but are not limited to, organic dopants and inorganic dopants. These dopants may be used alone or in combination thereof. The dopant may be selected from the group consisting of ionic liquids, acidic compounds, organic molecular compounds, and organic polymeric compounds. For example, the dopant may be selected from the group consisting of, but not limited to, $NO_2BF_4$, $NOBF_4$, $NO_2SbF_6$, HCl, $H_2PO_4$, $H_3CCOOH$, $H_2SO_4$, $HNO_3$, PVDF, Nafion, $AuCl_3$, $HAuCl_4$, $SOCl_2$, $Br_2$, dichlorodicyanoquinone, oxone, dimyristoylphosphatidylinositol, and trifluoromethanesulfoneimide.

For example, the graphene layer may be formed on the substrate having transparency, flexibility, stretchability or a combination thereof, but is not limited to this form. For example, the graphene layer may take the form of a roll. In an exemplary embodiment, the method may include doping the graphene layer by a roll-to-roll process, laminating another graphene layer on the doped graphene layer, and repeating the doping once or more by a roll-to-roll process. In an exemplary embodiment, the method may include laminating the graphene layer with another graphene layer, repeating the lamination once or more, and doping the resulting graphene layers by a roll-to-roll process. In an exemplary embodiment, the graphene layer may be formed on a support foil for graphene growth including a metal catalyst by supplying a carbon source and heat to the support.

In an exemplary embodiment, the roll-to-roll method for doping the graphene layer may include: (A) supplying a carbon source and heat to a support foil for graphene growth including a metal catalyst to form a graphene layer on the support, (B) bringing a flexible substrate into contact with the graphene layer and rolling the resulting structure with an adhesive roller to form a first graphene sheet including the support foil for graphene growth, the graphene layer, and the flexible substrate, (C) dipping the first graphene sheet in an etching solution and passing the first graphene sheet through a roller to transfer the graphene layer to the flexible substrate while simultaneously removing the support foil for graphene growth by etching, to form a second graphene sheet including the graphene layer and the flexible substrate, (C') dipping the second graphene sheet in a solution containing an organic dopant, an inorganic dopant or a combination thereof and passing the second graphene sheet through the solution or evaporating the doping solution and passing the second graphene sheet through the dopant vapor to dope the graphene layer of the second graphene sheet, and (D) bringing a target substrate into contact with the doped graphene layer of the second graphene sheet and rolling the resulting structure with a transfer roller to transfer the doped graphene layer to the target substrate.

In an exemplary embodiment, the graphene layer formed by supplying a carbon source and heat to the support foil for graphene growth including a transition metal catalyst may be prepared, for example, in an 8-inch diameter tubular quartz reactor introduced into a CVD system. In this embodiment, a single layer of graphene may be formed on the support foil for graphene growth, for example, a roll of a metal foil, such as a large-area Cu foil with a diagonal length of about 30 inches. Since a general tubular reactor has a large temperature gradient in the radial direction, graphene grows non-uniformly on a metal foil, such as a Cu foil. To solve this problem, for example, an about 7.5 inch quartz tube wrapped with a Cu foil is inserted into and fixed to an about 8 inch quartz tube so that non-uniformity in the radial direction at a reaction temperature can be minimized.

For example, the method may include doping the graphene layer by a roll-to-roll process, laminating another graphene layer on the doped graphene layer, and repeating the doping by a roll-to-roll process once or more. For example, the method may include laminating the graphene layer with another graphene layer, repeating the lamination once or more, and doping the resulting graphene layers by a roll-to-roll process. In an exemplary embodiment, the flexible substrate may include a polymer. A non-limiting example of the polymer may be a thermal release polymer. In an exemplary embodiment, the method may include performing thermal treatment, simultaneously with the rolling, to easily detach the graphene layer from the flexible substrate. By this process, a large area of the graphene layer can be transferred to and doped on the target substrate from the support for graphene growth. In addition, the transfer and doping processes can be easily carried out at reduced cost in a short time.

That is, according to the method for roll-to-roll transfer of the graphene layer, the graphene layer can be transferred to various substrates at reduced cost by a simple process, as described above. The transfer method enables the production of a graphene-based film for the attenuation of near-field electromagnetic waves and heat dissipation, and the fabrication of an electronic device and a circuit board including the film.

Mode for Invention

The following examples are given to assist in understanding the aspects and embodiments of the invention. However, these examples are merely illustrative and are not to be construed as limiting the scope of the invention.

EXAMPLES

1. Growth of Large-Area Graphene Layer on Copper Foil

An about 7.5 inch quartz tube was wrapped with a Cu foil (thickness: 25 μm, size: 210×297 mm$^2$, Alfa Aesar Co.) to form a roll of the Cu foil. The quartz tube was inserted into and fixed to an about 8 inch quartz tube. Thereafter, the quartz tube was heated to 1,000° C. at 180 mTorr under a flow of 10 sccm H$_2$. After the temperature of the quartz tube reached 1,000° C., the quartz tube was annealed for 30 min while maintaining the hydrogen flow and pressure. Subsequently, a gas mixture including a carbon source (CH$_4$: H$_2$=30:10 sccm) was supplied to the quartz tube at 1.6 Torr for 15 min to grow graphene on the Cu foil. The graphene-grown Cu foil was cooled to room temperature at a rate of about 10° C./s under a flow of H$_2$ at a pressure of 180 mTorr in a short time to obtain a graphene layer grown on the Cu foil.

2. Coating of Graphene Protective Film by Roll-to-Roll Process

Thereafter, a flexible PET polymer substrate having a pressure sensitive adhesive layer was brought into contact with the graphene layer formed on the Cu foil and was passed through a roller for adhesion. Next, the laminate of the Cu foil, the graphene layer, and the flexible polymer substrate was dipped in a 0.5 M aqueous FeCl$_3$ solution as an etching solution to remove the Cu foil by electrochemical reaction. After the etching, the graphene layer was transferred to the flexible polymer substrate to form a graphene support film. For further improvement of physical properties and protection against external impact or damage, a polymer such as polydimethylsiloxane (PDMS) or polymethyl methacrylate (PMMA) was coated on the graphene surface to form a protective layer. A suitable process such as spin coating, spray coating, casting or squeezing can be applied to the formation of the protective layer. Depending on the choice of the process, the kind, thickness, etc. of the protective layer can be controlled.

3. Transfer and Roll-to-Roll Doping of Graphene Layer

A thermal release tape (Jin Sung Chemical Co. and Nitto Denko Co.) was allowed to come into contact with the graphene layer formed on the Cu foil and was passed through an adhesive roller consisting of two rollers under a low pressure of about 2 MPa. As a result, the graphene layer was adhered to the thermal release tape. Next, the laminate of the Cu foil, the graphene layer, and the thermal release tape was dipped in a 0.5 M aqueous FeCl$_3$ solution or a 0.15 M (NH$_4$)$_2$S$_2$O$_8$ solution as an etching solution to remove the Cu foil by electrochemical reaction. After the etching, a laminate of the graphene layer and the thermal release tape was obtained. The graphene layer was washed with deionized water to remove remaining etching components. Next, a target substrate was allowed to come into contact with the graphene layer transferred to the thermal release tape, and the resulting structure was passed through a transfer roller under heating at 90-120° C. for 3-5 min to transfer the graphene layer from the thermal release tape to the target substrate. If desired, the above procedure can be repeated on the same target substrate to transfer a plurality of graphene layers to the target substrate. The target substrate may be, for example, a 188 μm thick polyethylene terephthalate (PET) substrate having a 34-inch scale in the diagonal direction.

Subsequently, one or more graphene layers transferred to the target substrate was prepared by a roll-to-roll process, as illustrated in the foregoing embodiments and FIGS. 12 and 13. Specifically, one or more graphene layers transferred to the target substrate were dipped in a solution containing wt % HNO$_3$ for about 5 min and passed through a roll-to-roll transfer system, as illustrated in FIGS. 12 and 13. As a result, the graphene layers were p-doped. Doping with a dopant can be induced to improve the electrical properties of graphene. As the dopant, there may be used an organic dopant, an inorganic dopant or a combination thereof. Specifically, the dopant may be selected from the group consisting of NO$_2$BF$_4$, NOBF$_4$, NO$_2$SbF$_6$, HCl, H$_2$PO$_4$, H$_3$CCOOH, H$_2$SO$_4$, HNO$_3$, PVDF, Nafion, AuCl$_3$, HAuCl$_4$, SOCl$_2$, Br$_2$, dichlorodicyanoquinone, oxone, dimyristoylphosphatidylinositol, trifluoromethanesulfoneimide, and combinations thereof. The respective graphene layers may be subjected to repeated doping with the dopant and transfer (layer-by-layer doping). Alternatively, only the outermost graphene layer may be doped with the dopant. A wet or dry method can be applied without limitation for the transfer.

FIGS. 14 and 15 are graphs showing the sheet resistance and transmittance values of the graphene layers coated on a PET film and a SiO$_2$/Si substrate by layer-by-layer transfer. UV-vis-NIR spectroscopy was used for the transmittance measurement, and a 4 point probe was used for the sheet resistance measurement. FIG. 14 shows changes in the sheet resistance of the doped graphene layers with different numbers of layers. The sheet resistance of the undoped 1-layer graphene was about 372Ω/□ and that of the 3-layer graphene was decreased to 145Ω/□. The sheet resistance of the 3-layer graphene surface doped with nitric acid was significantly decreased to 103Ω/□. FIG. 15 is a graph showing the transmittance values (at 550 nm) of graphene coated on a PET substrate by roll-to-roll layer-by-layer transfer to the PET substrate. The relative transmittance of 1-layer graphene was about 97.4% relative to that of PET. The transmittance values of 2-layer graphene and 3-layer graphene were about 93.4% and 91.5%, respectively. The transmittance showed a linear decrease with increasing thickness of the graphene. There was no substantial difference in transmittance between the 3-layer graphene doped with nitric acid (about 91.7%) and the undoped graphene. These results indicate that high transmittance can be obtained despite the reduced resistance by doping.

As an example of the polymer film layer, a polyimide film with excellent insulation properties was used. The polyimide film was produced by the following procedure. First, pyromelliticdianhydride (PMDA) was allowed to react with oxydianiline (ODA) in N-methylpyrrolidine (NMP) as a solvent. As a result of the reaction, a polyamic acid solution was obtained. The polyamic acid solution was coated and thermally cured at a temperature of 250-450° C. to produce the desired polyimide film. Alternatively, when a low reaction temperature was required, the polyimide film was produced using a photosensitive polyamic acid solution obtained as a result of the reaction of photosensitive monomers. The thickness of the polyimide film was adjusted to 1-1,000 nm by varying the concentration of polyamic acid. If needed, the thickness of the polyimide film was adjusted to 1,000 nm or above.

For comparison with the characteristics of graphene, a nanogranular magnetic thin film was coated on graphene using a high vacuum DC magnetron sputtering system and a polymer dielectric layer such as a polyimde layer was formed thereon. The high vacuum system for the formation of the magnetic thin film includes a main chamber equipped with a magnetic alloy target and an ion milling device. 99.999% Ar gas was used as a sputtering gas for the thin film formation. The internal pressures of the main chamber and a load-lock chamber were maintained at $1.0 \times 10^{-8}$ torr or less and $5 \times 10^{-7}$ torr or less, respectively, to minimize the influence of residual gas. For a Co—Fe alloy thin film, deposition conditions, such as gas flow, deposition pressure, and deposition power, were controlled such that the deposition rate was 1.5-2.5 Å/sec. For a Ni—Fe magnetic thin film, the deposition conditions were controlled such that the deposition rate was 1-2 Å/sec. In order to induce magnetic anisotropy and set the exchange bias direction in the thin film during production, a specimen holder was used where a uniform magnetic field of 100±5 Oe could be created in a specimen. The Co—Fe and Ni—Fe magnetic thin films were coated on a predetermined position of a silicon circuit substrate or a flexible substrate, coated with the polyamic acid solution using a spin coater at 2,500 rpm for 30 sec, and dried. The dried samples were annealed at 100-450° C. in different atmospheres, such as oxidizing, hydrogen, and vacuum atmospheres, to obtain granular magnetic thin films dispersed in the polyimide (PI). The Co—Fe ratio and the Ni—Fe ratio of the magnetic layers were 90:10 and 89:11, respectively. The thickness of each layer was 10 nm. The nanogranular films had soft magnetic properties and were suitable for noise attenuation.

For characterization, a noise attenuation layer of 50 mm×50 mm was formed on microstrip lines formed on a dielectric substrate using a network analyzer (HP 8720). The transmission coefficient ($S_{21}$) and reflection coefficient ($S_{11}$) between the transmission lines were measured. The effect of the layer on the attenuation of electromagnetic waves was evaluated based on the ratio of loss power to input power ($P_{loss}/P_{in}$).

The difference between the loss power-input power ratio of the noise attenuation layer and the loss power/input power ratio of the microstrip line without the noise attenuation layer ($\Delta P_{loss}/P_{in}$) was calculated by the following equation:

$$\Delta P_{loss}/P_{in} = [P_{loss}/P_{in}]_{Noisesuppressionlayer} - [P_{loss}/P_{in}]_{Withoutlayer}$$

FIG. 16 shows the effects of the circuit devices having the structures of FIGS. 1 to 10 on the attenuation of electromagnetic waves between the transmission lines. In each structure, a noise attenuation layer including multilayer doped graphene or graphene was formed on the transmission lines. As a result, the attenuation effects were increased with increasing number of the graphene layers. Particularly, AuCl$_3$ doped graphene showed the highest attenuation effect.

FIGS. 17 and 18 are graphs showing the frequency dependency of power losses between transmission lines ($P_{loss}/P_{in}$), which were measured on the AuCl$_3$ doped graphene (3-layer)/PET structure of FIG. 10, the PMMA or PDMS/graphene/PET structure of FIG. 4, the 15Ω/□ ITO (transmittance 80%, Peccell Technologies Inc.)/PEN (polyethylene naphthalate) structure of FIG. 1, the 10 nm-thick CoFe—NiFe soft magnetic layer/PI layer structure of FIG. 1, and the FeSiAl composite/PET noise attenuation layer structure of FIG. 1, each of which was formed on the transmission lines by a microstrip line method to have an area of 50×50 mm, and reflection coefficients ($S_{11}$) of the structures. FIG. 17 compares the effects of the doped graphene film, the soft magnetic film, the soft magnetic power composite film, and the ITO film on the attenuation of electromagnetic waves in the radio frequency (RF) and semi-microwave bands of 10 MHz to 6 GHz. The doped graphene film showed the best effect on the attenuation of electromagnetic waves despite its very small thickness (about 1 nm) and high transmittance. Since the attenuation effect of a film is proportional to its thickness, the better attenuation effect of the doped graphene film than the 10 nm-thick soft magnetic film demonstrates that the effect of graphene on the attenuation of electromagnetic waves is a minimum of tens to hundreds of times greater than that of the soft magnetic material. The graphene films, particularly, the monolayer graphene, showed very large effects on the attenuation of electromagnetic waves at 1 GHz or less when compared to the soft magnetic film and the ITO film. The reflection losses of the ITO film and the 3-layer doped graphene were slightly higher at about 1 GHz or below but were lower at 1 GHz or above than the reflection losses of the soft magnetic film. Particularly, the PMMA- and PDMS-coated graphene structures were found to have very low reflection losses. Generally, a low electrical resistance means an increase in resistance loss in the semiconductor region, leading to improved attenuation effect and increased reflection loss. In contrast, a low electrical resistance leads to a greatly reduced reflection loss in the GHz region, which is a very unusual phenomenon. This demonstrates that graphene is very effective in the attenuation of electromagnetic waves in the GHz region. FIG. 19 is a graph comparing power losses ($P_{loss}/P_{in}$) between the transmission lines, which were measured on the doped graphene (3-layer)/PET structures of FIGS. 8 and 10 and the 15Ω/□ ITO/PEN structures of FIGS. 1 and 2, each of which was formed on the transmission lines by a microstrip line method. FIG. 19 shows that the power loss in each structure was slightly different depending on the interval between the transmission lines and the insulating layer and the physical properties of the insulating layer. These results indicate that the maximized attenuation effect can be achieved by varying the structure of the passive layer for the attenuation of near-field electromagnetic waves and heat dissipation according to the present invention so as to conform the circuit designs of various devices.

FIG. 20 is a graph showing values obtained by dividing the power loss-to-thickness ratios (($P/t)_{Graphene}$) of the AuCl$_3$ doped graphene (3-layer)/PET film structure of FIG. 2 by the power loss-to-thickness ratios (($P/t)_{ITO}$) of the 15Ω/□ ITO/PEN structure of FIG. 2. As can be seen from FIG. 20, the effect of graphene on the attenuation of electromagnetic waves is hundreds to ten thousands of times greater than that of ITO. Since the electrical conductivity of the AuCl$_3$ doped 3-layer graphene ($3.3 \times 10^7$ S/m) is about one hundred times higher than that of ITO ($3.3 \times 10^5$ S/m) and the electromagnetic wave attenuation effect is proportional to the square root of electrical conductivity, it is expected that the synergistic effect of graphene is about 10 times greater than that of ITO. According to the actual results, the electromagnetic wave attenuation effect of graphene was different by hundreds to ten thousands of times from that of ITO. In conclusion, it is estimated that this difference is also strongly influenced by factors other than electrical conductivity.

FIG. 21 shows the magnetic moments of doped graphene (1-layer) measured using an alternating gradient magnetometer system (AGM). The doped graphene had a saturation magnetization of 1,240 emu/cm$^3$ at a magnetic field of 98.3 Oe, demonstrating ferromagnetism of graphene. Graphene, which is slightly doped with magnetic impurities, has a high saturation magnetization comparable to that of a ferromagnetic Fe thin film (1,700 emu/cm$^3$). It is believed that the better electromagnetic wave attenuation effect of graphene than that of ITO is greatly attributed to the ferromagnetism of graphene other than electrical conductivity.

According to the present invention, the organic/inorganic composite noise attenuation layer consisting of the polymer layer and the graphene layer is patterned and inserted around a noise-radiating printed circuit board, a silicon integrated circuit board, a polymer film or a flexible substrate or is arranged in the form of a film in/on the noise source, in particular near-field noise source, so that it is very effective in attenuating noises in the RF or semi-microwave band. Particularly, graphene has high electromagnetic wave attenuation performance even at a thickness of 1 nm or less, which has not been achieved in conventional soft magnetic materials, and exhibits high attenuation performance even at a transmittance higher than that of ITO. Therefore, graphene is effective in attenuating noises in display devices that require transparency. Particularly, graphene has the potential to replace ITO and is a particularly promising transparent electromagnetic wave absorber for an intelligent transport system (ITS), such as a high-pass terminal in the band of 5.8 GHz.

In addition, the passive element can be applied in the form of a thin film or insertion and is not mounted in the form of a part. Therefore, the passive element is effective in reducing interference of electromagnetic waves from a subminiature device such as a high-integration circuit device.

Furthermore, the passive element can rapidly counteract noises even in devices with short life cycles, such as smart phones. Particularly, the passive element has better heat dissipation performance than any other existing material, thus being effective in achieving miniaturization and high integration of electronic devices.

INDUSTRIAL APPLICABILITY

As is apparent from the foregoing, the passive layer of the present invention is applicable to transparent films for noise attenuation and heat dissipation and various types of electronic devices including the transparent films. In the near future, the passive layer of the present invention is expected to contribute to the fabrication of thin film devices and nanodevices.

The invention claimed is:
1. An electromagnetic device comprising (a) a base, (b) one or more active layers with a small gap of insulator, (c) one or more multilayer passive layers for the attenuation of near-field electromagnetic waves and heat dissipation comprising a graphene layer and a polymer layer, and (d) one or more low dielectric constant layers,
wherein the passive layers for the attenuation of near-field electromagnetic waves and heat dissipation are in contact with the low dielectric constant layers,
the base is in contact with one of the passive layers for the attenuation of near-field electromagnetic waves and heat dissipation, one of the low dielectric constant layers, or both of them,
one of the multilayer passive layers for the attenuation of near-field electromagnetic waves and heat dissipation is formed on the active layers, one of the low dielectric constant layers is formed on the active layers, or the active layers are surrounded by one of the low dielectric constant layers,
the low dielectric constant layers are selected from the group consisting of oxide layers, nitride layers, carbide layers, and polymer layers,
the multilayer passive layers for the attenuation of near-field electromagnetic waves and heat dissipation are undoped or doped with either an organic dopant or an inorganic dopant or both of them, the base is selected from the group consisting of metal bases, ceramic bases, polymer bases, silicon bases, flexible circuit substrates, rigid circuit substrates, and flexible films, the active layers are selected from the group consisting of signal circuit lines, ground circuit lines, transmission circuit lines, electrodes, semiconductor layers, and memory layers, and the electromagnetic device is selected from the group consisting of thin film devices, nanodevices, semiconductor devices, memory devices, molecular devices, optical devices, display devices, digital devices, and devices comprising a rigid or flexible substrate, wherein the graphene layer is essentially free of carbon nanotubes.

2. The electromagnetic device according to claim 1, wherein at least some of the active layers (b) are formed on portions of the upper surface of the base (a), one of the multilayer passive layers (c) for the attenuation of near-field electromagnetic waves and heat dissipation is formed as a film or is patterned on the upper portions of the some of the active layers and the remaining portion of the upper surface of the base on which the some active layers are not formed, and one of the low dielectric constant layers (d) is formed on the upper surface of the multilayer passive layer.

3. The electromagnetic device according to claim 2, wherein the multilayer passive layer for the attenuation of near-field electromagnetic waves and heat dissipation is a composite passive layer for the attenuation of near-field electromagnetic waves and heat dissipation consisting of two or more multilayer passive layers, and the active layers are surrounded by another low dielectric constant layer.

4. The electromagnetic device according to claim 1, wherein at least some of the active layers (b) are formed on portions of the upper surface of the base (a), one of the low dielectric constant layers (d) is formed on the upper portions of the some active layers and the remaining portion of the upper surface of the base on which the some active layers are not formed, and one of the multilayer passive layers for the attenuation of near-field electromagnetic waves and heat dissipation is formed on the upper surface of the low dielectric constant layer.

5. The electromagnetic device according to claim 4, wherein another layer of the low dielectric constant layers (d) is further formed on the multilayer passive layer for the attenuation of near-field electromagnetic waves and heat dissipation formed on the upper surface of the low dielectric constant layer.

6. The electromagnetic device according to claim 5, wherein the multilayer passive layer for the attenuation of near-field electromagnetic waves and heat dissipation formed on the upper surface of the low dielectric constant layer is a composite passive layer for the attenuation of near-field electromagnetic waves and heat dissipation consisting of two or more multilayer passive layers for the attenuation of near-field electromagnetic waves and heat dissipation, and the two or more multilayer passive layers for the attenuation of near-field electromagnetic waves and heat dissipation are doped with a dopant.

7. The electromagnetic device according to claim 6, wherein a further composite passive layer for the attenuation of near-field electromagnetic waves and heat dissipation is formed on the upper surface of the low dielectric constant layer formed on the multilayer passive layer for the attenuation of near-field electromagnetic waves and heat dissipation, and a further low dielectric constant layer is formed on the upper surface of the further composite passive layer for the attenuation of near-field electromagnetic waves and heat dissipation.

8. The electromagnetic device according to claim 1, wherein one of the multilayer passive layers (c) for the attenuation of near-field electromagnetic waves and heat dissipation is formed on the upper surface of the base (a), and at least some of the active layers (b) and at least one layer of the low dielectric constant layers (d) surrounding the some active layers are formed on the multilayer passive layer for the attenuation of near-field electromagnetic waves and heat dissipation.

9. The electromagnetic device according to claim 8, wherein another layer of the multilayer passive layers for the attenuation of near-field electromagnetic waves and heat dissipation is formed on the upper surface of the low dielectric constant layer formed on the multilayer passive layer, and another layer of the low dielectric constant layers is formed on the upper surface of the another passive layer for the attenuation of near-field electromagnetic waves and heat dissipation.

10. The electromagnetic device according to claim 1, wherein one of the low dielectric constant layers (d) is formed on the upper surface of the base (a), one of the multilayer passive layers (c) for the attenuation of near-field electromagnetic waves and heat dissipation is formed on the upper surface of the low dielectric constant layer, and at least some of the active layers (b) and at least one layer of the low dielectric constant layers (d) surrounding the active layers are formed on the multilayer passive layer for the attenuation of near-field electromagnetic waves and heat dissipation.

11. The electromagnetic device according to claim 1, wherein at least some of the active layers (b) and at least one layer of the low dielectric constant layers (d) surrounding the active layers are formed on the upper surface of the base (a), one of the multilayer passive layers (c) for the attenuation of near-field electromagnetic waves and heat dissipation is formed on the upper surface of the low dielectric constant layer, the multilayer passive layer for the attenuation of near-field electromagnetic waves and heat dissipation formed on the upper surface of the low dielectric constant layer is a composite passive layer for the attenuation of near-field electromagnetic waves and heat dissipation consisting of two or more multilayer passive layers for the attenuation of near-field electromagnetic waves and heat dissipation, and the two or more multilayer passive layers for the attenuation of near-field electromagnetic waves and heat dissipation are doped with a dopant.

12. The electromagnetic device according to claim 11, wherein a further low dielectric constant layer is formed on the upper surface of the composite passive layer for the attenuation of near-field electromagnetic waves and heat dissipation, and a further composite passive layer for the attenuation of near-field electromagnetic waves and heat dissipation is formed on the upper surface of the further low dielectric constant layer.

* * * * *

UNITED STATES PATENT AND TRADEMARK OFFICE
CERTIFICATE OF CORRECTION

PATENT NO. : 9,924,619 B2  
APPLICATION NO. : 14/345996  
DATED : March 20, 2018  
INVENTOR(S) : Sang Woo Kim et al.

Page 1 of 1

It is certified that error appears in the above-identified patent and that said Letters Patent is hereby corrected as shown below:

On the Title Page

Please add the Assignee of "RESEARCH & BUSINESS FOUNDATION SUNGKYUNKWAN UNIVERSITY, Seoul, Republic of Korea" to Item (73).

Signed and Sealed this  
Seventh Day of April, 2020

Andrei Iancu  
*Director of the United States Patent and Trademark Office*